United States Patent [19]

Yamaguchi

[11] Patent Number: 5,563,368

[45] Date of Patent: Oct. 8, 1996

[54] THERMOELECTRIC POWER GENERATING DEVICE

[75] Inventor: Sataro Yamaguchi, Aichi, Japan

[73] Assignees: UniNet Co., Ltd., Tokyo; Shikoku Research Institute Inc., Kagawa, both of Japan

[21] Appl. No.: 306,913

[22] Filed: Sep. 16, 1994

[30] Foreign Application Priority Data

Sep. 17, 1993 [JP] Japan .................................. 5-254826
Nov. 1, 1993 [JP] Japan .................................. 5-293850

[51] Int. Cl.$^6$ .................................................. H01L 37/00
[52] U.S. Cl. ........................ 136/205; 136/200; 136/208; 136/209; 136/210; 136/211; 136/224; 310/306
[58] Field of Search ...................................... 136/200, 202, 136/205, 208, 209, 210, 211, 212, 224, 225, 227; 310/306, 307

[56] References Cited

U.S. PATENT DOCUMENTS

| | | | |
|---|---|---|---|
| 2,390,578 | 12/1945 | Findley | 136/4 |
| 2,410,872 | 11/1946 | Findley | 136/4 |
| 2,415,005 | 1/1947 | Findley | 136/4 |
| 2,425,647 | 8/1947 | Sarver | 171/97 |
| 2,864,879 | 12/1958 | Toulmin, Jr. | 136/4 |
| 2,919,356 | 12/1959 | Fry | 310/4 |
| 2,919,553 | 1/1960 | Fritts | 62/3 |
| 3,090,875 | 5/1963 | Harkness | 310/4 |
| 3,119,939 | 1/1964 | Von Koch | 310/4 |
| 3,154,927 | 11/1964 | Simon | 62/3 |
| 3,326,727 | 6/1967 | Fritts | 136/208 |
| 3,428,496 | 2/1969 | Lockwood | 136/208 |
| 3,481,794 | 12/1969 | Kasschau | 136/208 |
| 4,859,250 | 8/1989 | Buist | 136/225 |
| 5,022,928 | 6/1991 | Buist | 136/212 |
| 5,393,350 | 2/1995 | Schroeder | 136/205 |

OTHER PUBLICATIONS

K. Uemura and I. Nishida, "Thermal semiconductors and their Applications", Dec. 1988, p. 127.

*Primary Examiner*—Charles T. Jordan
*Assistant Examiner*—Chrisman D. Carroll
*Attorney, Agent, or Firm*—Fish & Richardson, P.C.

[57] ABSTRACT

A thermoelectric conversion member formed by a thermoelectric conversion element has a split ring shaped transverse cross section. Electrodes are disposed on ring ends of the thermoelectric conversion member facing each other. A magnetic field generating unit generates a magnetic field in a direction perpendicular to the transverse cross-sectional plane of the thermoelectric conversion member. A heating unit for heating one side of an annular wall of the thermoelectric conversion member and a cooling unit provided on the opposite side of the annular wall of the thermoelectric conversion member produces a temperature gradient in a direction radially of the thermoelectric conversion member. Electric field is induced in the direction perpendicular to both directions of the magnetic field and the temperature gradient, that is in the circumferential direction of the ring of the thermoelectric conversion member under the Nernst effect, enabling an electric voltage to be taken out at the electrodes.

20 Claims, 10 Drawing Sheets

THERMOELECTRIC POWER GENERATING DEVICE

FIELD OF THE INVENTION

This invention relates to a thermoelectric power generating device and more particularly to a thermoelectric power generating device which generates electric power under the Nernst effect.

Related Art

If a metal piece or a n-type thermoelectric semiconductor piece having free electrons is heated at its one end, the electrons at a high-temperature side are increased in their kinetic energy and diffused towards the low-temperature side, such that the electron density at the high-temperature side and that at the low-temperature side are decreased and increased, respectively, as a result of which a potential difference is produced. In case of a p-type thermoelectric semiconductor having holes as carriers, a potential difference is generated in the reverse direction.

This phenomena is called the Seebeck effect on which the principle of a thermoelectric generation is based. A voltage is taken to outside by combining p-type and n-type thermoelectric semiconductor.

Figure 7:
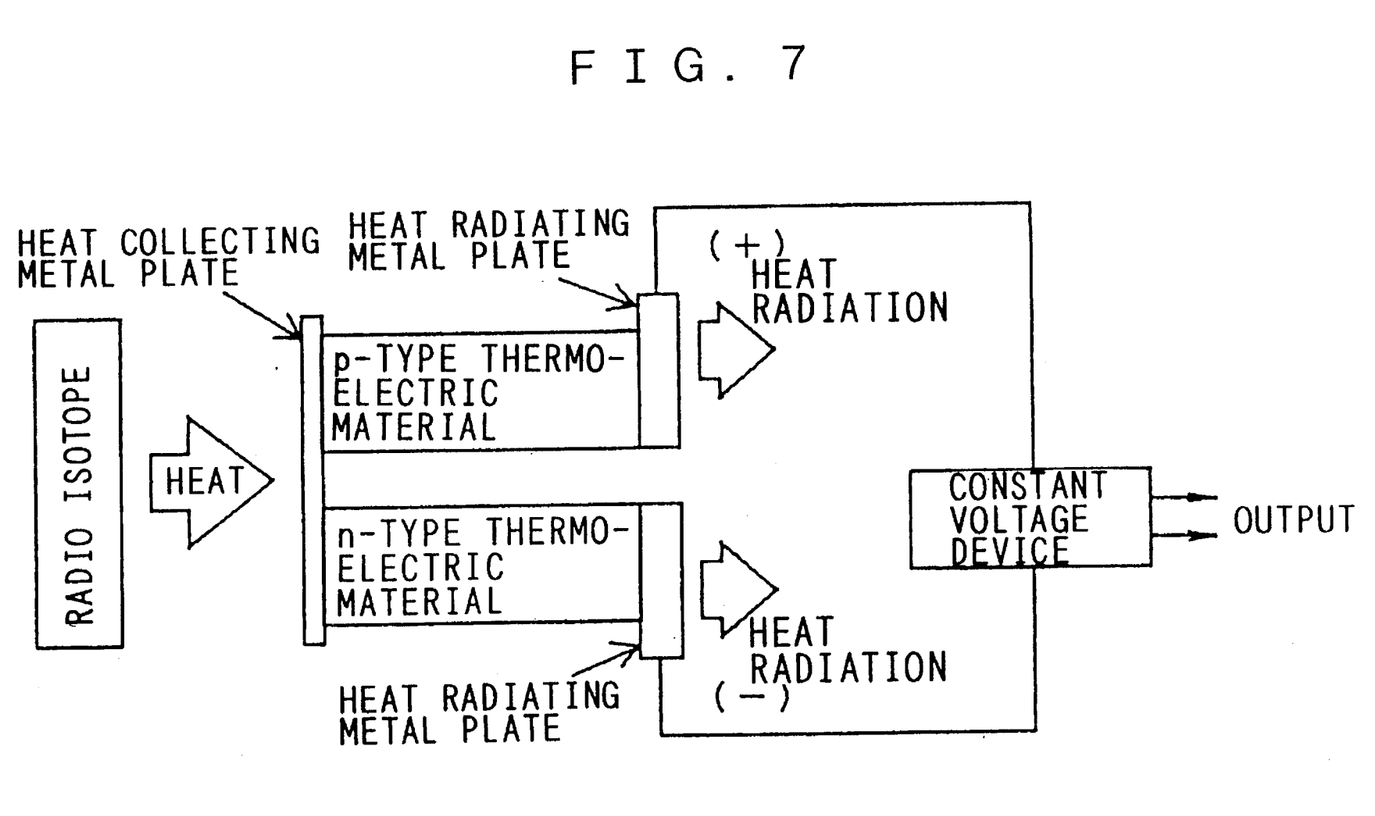
FIG. 7 is a schematic block diagram showing the principle of a conventional thermoelectric generator.

Referring to FIG. 7, a radio isotope thermoelectric power generator(RTG), as an example of a conventional thermoelectric generator is explained. In this connection, reference is also had to "Thermal Semiconductors and their Applications" by K. Uemura and I. Nishida, issued by NIKKAN KOGYO SHIMBUN-SHA, December 1988, page 127.

FIG. 7 shows a schematic diagram of a conventional thermoelectric generator of a II-type structure employing a radio isotope (RI) as a heat source. A "II-type structure" refers to a structure formed by an n-type thermoelectric material, a p-type thermoelectric material and a heat-collecting metal plate that, when viewed from the side in FIG. 7, for example, has a shape similar to the symbol "II".

Referring to FIG. 7, an n-type thermoelectric material formed of an n-type semiconductor and a p-type thermoelectric material formed of a p-type semiconductor have their one ends connected to each other via a heat-collecting metal plate (p-n junction electrode) and have their other ends mounted with heat-radiating metal plates (low-temperature electrode). The heat-collecting metal plate is heated by the heat-source to a higher temperature. The heat transmitted from the heat-collecting metal plate to the low-temperature electrodes provided at the opposite ends of the p-type and n-type semiconductors is radiated via a heat radiator, not shown. The plus(+) electrode of the p-type thermoelectric material and the minus(−) electrode of the n-type thermoelectric material are connected to a constant voltage unit for outputting a constant voltage to outside.

Discussion of the Related Art

With the conventional thermoelectric generator, the thermoelectric semiconductor is evaluated by its figure of merit, or efficiency. The conventional thermoelectric generators suffer from a lower conversion efficiency than with existing turbine generators, mainly due to the low value of a thermoelectric power coefficient. The figure of merit(efficiency) Z of the thermoelectric generator which generates electric power based on the Seebeck effect is expressed as $Z=\alpha^2/\rho X$ where $\alpha$ is a thermoelectric power coefficient, $\rho$ is a electric resistivity and X is a thermal conductivity.

SUMMARY OF THE INVENTION

It is therefore an object of the present invention to provide a thermoelectric power generating device having its figure of merit significantly improved by utilizing the Nernst effect under which an electric field is induced in a direction perpendicular to both the magnetic field and the temperature gradient.

For accomplishing the above object, the present invention provides a thermoelectric power generating device for generating electric power under the Nernst effect comprising a thermoelectric conversion member formed of a thermoelectric conversion element, said thermoelectric conversion member having a split ring shaped cross section, a magnetic field generating unit for generating a magnetic field in a direction perpendicular to the cross-sectional plane of said thermoelectric conversion member, a heating unit for heating one side of an annular wall of said thermoelectric conversion member for producing a temperature gradient along a radial direction in said thermoelectric conversion member, a cooling unit at the other side of the annular wall of said thermoelectric conversion member, electrodes disposed at ring ends of said thermoelectric conversion member facing each other.

The present invention also provides a thermoelectrice power generating device wherein said thermoelectric conversion member comprises at least two thermoelectric conversion elements in the form of split rings stacked via an insulating layer along the radial direction.

The present invention also provides a thermoelectric power generating device wherein said thermoelectric conversion member comprises at least two thermoelectric conversion elements in the form of split rings stacked via an insulating layer along the direction of the magnetic field.

The present invention also provides a thermoelectric power generating device wherein the thermoelectric conversion member has its wall surface coated with a heat-resistant material.

In another aspect, the present invention provides a thermoelectric power generating device for generating electric power under the Nernst effect comprising a thermoelectric conversion member formed of a thermoelectric conversion element of a porous structure said thermoelectric conversion member having a split ring shaped cross section, a magnetic field generating unit for generating a magnetic field parallel to the longitudinal direction of said thermoelectric conversion member, a gas supplying unit for supplying a combustible gas from one side of an annular wall of said thermoelectric conversion member, a combustion unit for combusting said combustible gas within said thermoelectric conversion member, a gas exhausting unit for exhausting said combustible gas from the opposite side of said thermoelectric conversion member, and electrodes disposed at ring ends of said thermoelectric conversion member facing each other.

In still another aspect, the present invention provides a thermoelectric power generating device for generating electric power under the Nernst effect comprising a pipe arrangement having coaxially arranged inner and outer pipes having different radial dimensions and a thermoelectric conversion member having a split ring shaped cross section, arranged between the inner and outer pipes for encircling said inner pipe, and being formed of a thermoelectric conversion element, a magnetic field generating unit for generating a magnetic field in a direction perpendicular to a transverse cross-sectional plane of said thermoelectric conversion member, and electrodes disposed at ring ends of said thermoelectric conversion member facing each other, with the inside of said inner pipe being supplied with a high-temperature fluid and a gap between said outer pipe and the thermoelectric conversion member being supplied with a low-temperature fluid.

The present invention also provides a thermoelectric power generating device generating electric power under the Nernst effect comprising a plurality of pipe arrangements, each of said pipe arrangements comprising coaxially arranged inner and outer pipes having different radial dimensions and a thermoelectric conversion member having a split ring shaped transverse cross section, arranged between the inner and outer pipes for encircling said inner pipe, and being formed of a thermoelectric conversion element, electrodes disposed at ring ends of said thermoelectric conversion member facing each other, with the inside of said inner pipe being supplied with a high-temperature fluid and with the gap between said outer pipe and the thermoelectric conversion member being supplied with a low-temperature fluid, and a magnetic field generating unit for generating a magnetic field longitudinally of said pipe systems.

The present invention also provides a thermoelectric power generating device wherein the electrodes of the thermoelectric conversion members in said pipe arrangements are connected in series or in parallel.

The thermoelectric conversion element of the thermoelectric power generating device of the present invention preferably comprises a semiconductor.

SUMMARY OF THE PREFERRED EMBODIMENTS

The operation of the present invention is hereinafter explained.

With the thermoelectric power generating device of the present invention, thermoelectric conversion members are in the form of split rings, and electrodes are disposed at ring ends of the thermoelectric conversion members. A temperature gradient is produced along the radial direction of the thermoelectric conversion member by the heat source and the cooling unit. If a magnetic field is in a direction normal to the transverse cross-sectional plane of the thermoelectric conversion member, an electric field is induced by the Nernst effect in a direction perpendicular to both the temperature gradient and the direction of the magnetic field, that is in the circumferential direction of the ring, for enabling an electric voltage to be taken out at the electrodes. The synergistic effect of the strong magnetic field and the high temperature gradient leads to improved performance index and high efficiency output of the thermoelectric conversion member. A high output voltage may be produced with the use of a semiconductor as a thermoelectric conversion element.

In still another aspect of the present invention, a combustible gas is caused to flow from one side of the annular wall into the thermoelectric conversion element of a porous structure arranged in the form of a split ring. The gas is combusted within the porous thermoelectric power conversion element for providing a high temperature, with the combustible gas being discarded at the other end of the annular wall. The gas inlet side is maintained at a lower temperature. An electric field is induced in a direction perpendicular to both the magnetic field and the temperature gradient, that is in the circumferential direction of the ring, so that the electric voltage may be taken out at the electrode.

More specifically, when flowing through tiny holes, the gas is moved as it exchanges heat with the surrounding. At the inlet side, the gas absorbs the heat so that there is no significant rise in temperature. In the vicinity of the outlet, there is a sudden rise in temperature due to heat transported by the gas, in addition to the flame, so that a high temperature gradient within the inside of the thermoelectric conversion member is maintained. Besides, the effective heat conductivity of the thermoelectric conversion element is lowered, thus improving the figure of merit. A high voltage output may be produced under the synergistic effect oil the strong magnetic field and the high temperature gradient, thus achieving a high output, low cost and reduced weight of the thermoelectric power generating device.

In yet another aspect of the present invention, a thermoelectric power conversion member in the form of a split ring is provided between inner and outer pipes of a dual pipe system, and a magnetic field is applied in the longitudinal direction of the pipe system. The high temperature fluid is caused to flow through the inner pipe, and a low-temperature fluid is caused to flow in a space between the outside of the thermoelectric conversion member and the inside of the outer pipe, for generating a temperature gradient along the radial direction of the thermoelectric conversion member. A magnetic field is generated by magnetic field generating unit, such as a solenoid coil, provided outside of the outer pipe, along the longitudinal direction of the pipe. An electric field is induced by the Nernst effect in a direction perpendicular to both the temperature gradient and the direction of the magnetic field, that is in the circumferential direction of the ring, for producing an electrical voltage at a terminal voltage The figure of merit or efficiency of the thermoelectric conversion member is improved and a high efficiency output is produced under the synergistic effect of the strong magnetic field and the high temperature gradient. Above all, the power generation efficiency may be improved due to the pressure and the velocity of the fluid supplied to the dual pipe system and the temperature difference between the high temperature fluid and the low temperature fluid.

In yet another aspect of the present invention, plural conversion pipes each comprising a thermoelectric conversion member and a dual pipe system are provided, and a magnetic field is generated by a solenoid coil longitudinally of the pipe. A high output voltage may be taken out by connecting plural conversion pipes in series.

DESCRIPTION OF THE PREFERRED EMBODIMENTS

Referring to the accompanying drawings preferred embodiments of the present invention will be explained in detail.

Embodiment 1

Figure 1:
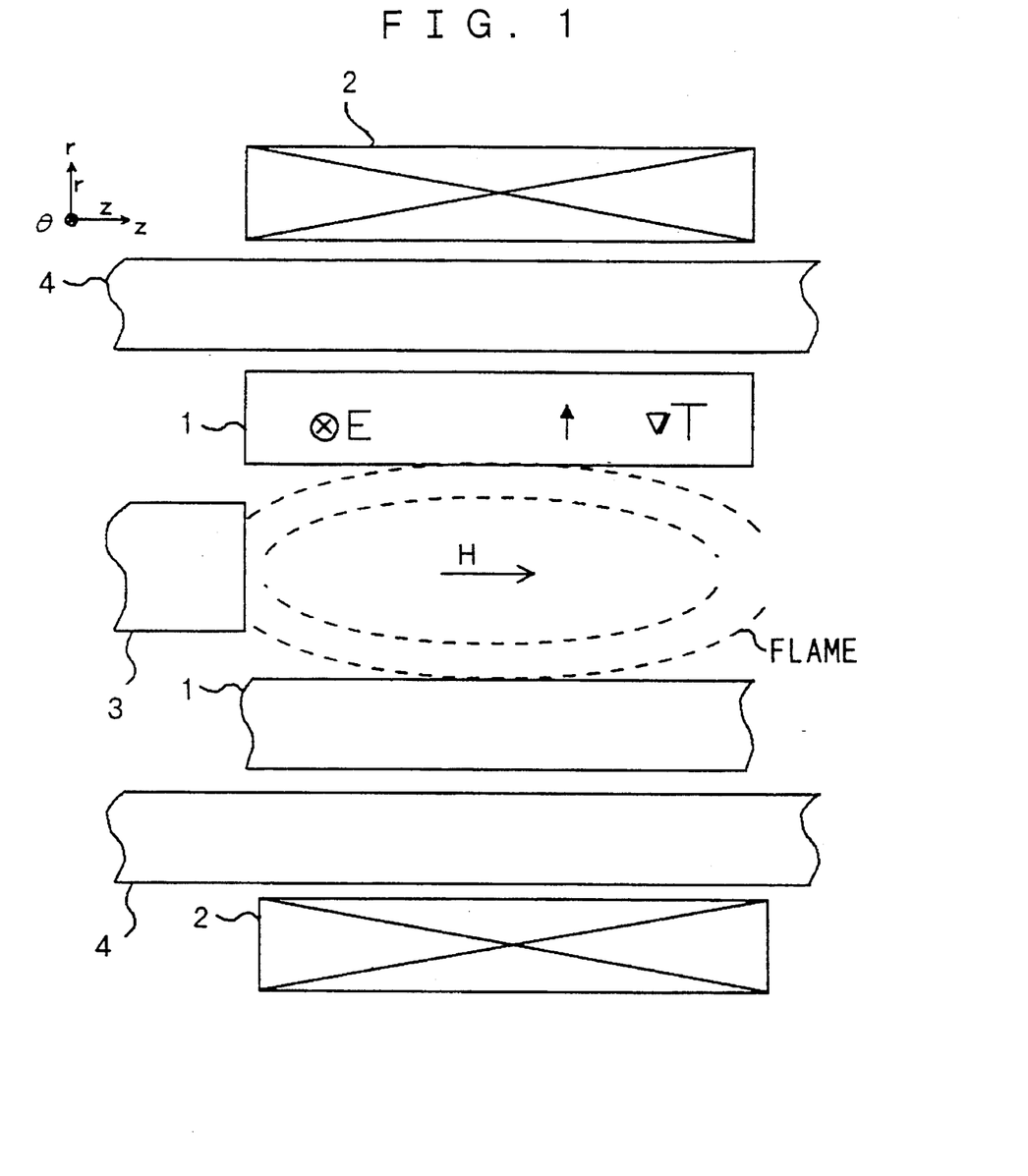
FIG. 1 is a schematic view showing a structure of a thermoelectric power generating device according to a first embodiment of the present invention.

Referring to FIG. 1, a first embodiment of the present invention will be explained.

FIG. 1 schematically shows the principle of a thermoelectric power generator according to an embodiment of the present invention which achieves thermoelectric power generation based on the Nernst effect.

As shown in FIG. 1, a thermoelectric conversion member 1 has its annular inner wall heated by a flame from a burner or heating unit 3 and has its annular outer wall cooled by a cooling device 4. A temperature gradient is generated within the interior of the thermoelectric conversion member 1 in a radial direction (r axis) or shown by an arrow in FIG. 1.

A solenoid coil 2, which may also be a superconducting coil, generates a magnetic field H in a direction normal to the transverse cross-sectional plane of the thermoelectric conversion member 1, that is in a direction Z in FIG. 1.

Figure 2:
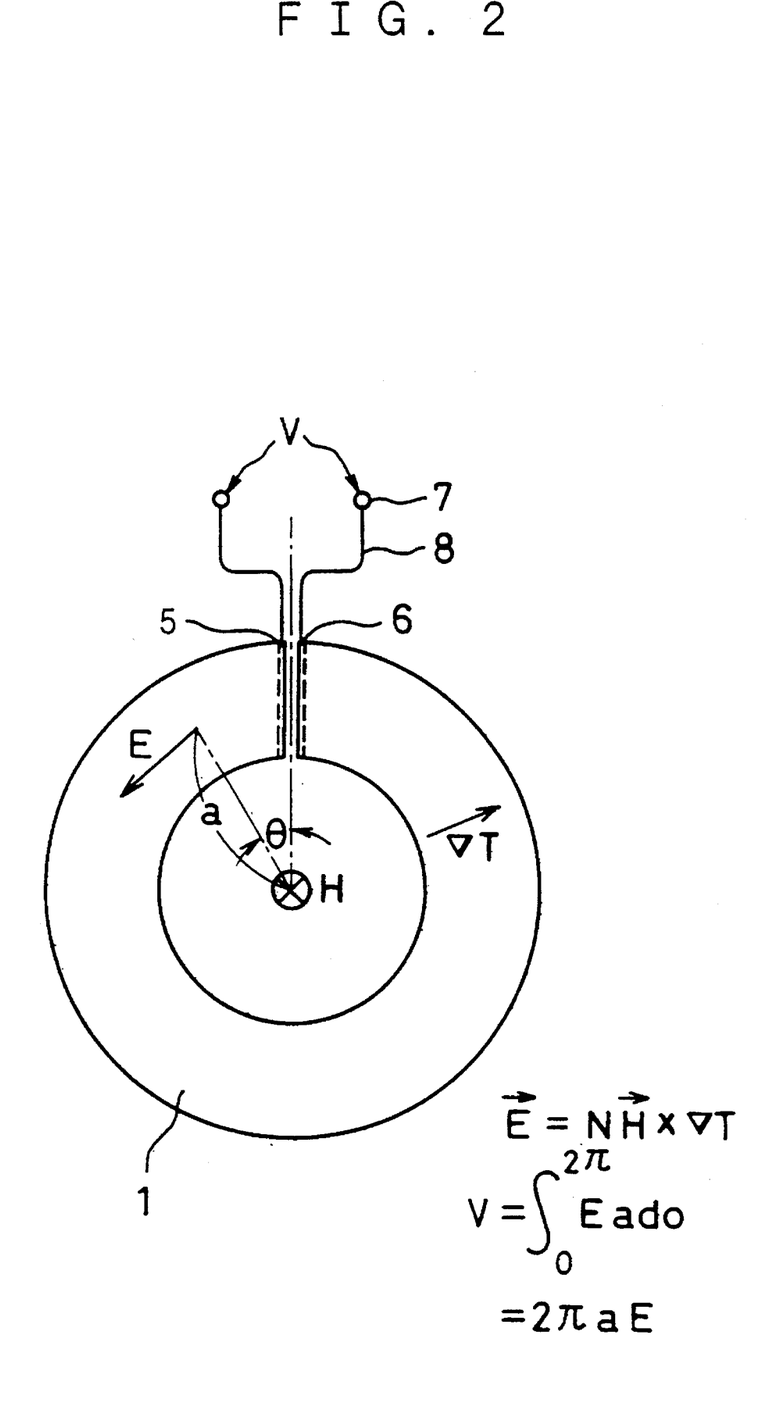
FIG. 2 is a transverse cross-sectional view showing a first aspect of the thermoelectric conversion member of the thermoelectric power generating apparatus according to the first embodiment.

FIG. 2 shows one of the transverse cross-sectional planes of the thermoelectric conversion member 1 shown in FIG. 1. As shown in FIG. 2, the thermoelectric conversion member 1 arranged in an inner spacing of the solenoid has a split ring shaped transverse cross section with at least a slip the opposing ends of which are mounted with a positive electrode 5 and a negative electrode 6 both of which are connected by a wiring 8 to external terminals 7.

Since the magnetic field generated by the solenoid coil 2 is along the Z-axis direction in FIG. 1, an electric field E is induced in a direction θ by the Nernst effect based on the temperature gradient and a magnetic field H. The electric field E and the voltage V are given by the following equations (1) and (2).

$$\vec{E} = N\vec{H} \times \text{grad } T \quad (1)$$

In the above equation (1), N, H and grad T stand for a constant of Nernst effect(Nernst coefficient), the strength of the magnetic field and the gradient of the temperature T, respectively. In the above equation (1), an operator "x" denotes a vector product.

As shown in FIG. 2, the electric field E takes a constant value in a direction normal to a radial direction (θ -direction) on the same radius a from the center of the ring shaped thermoelectic conversion member 1.

Thus the voltage V developed across the electrodes 5 and 6 is given by the following equation (2) in which an integration of the electric field E is carried along a path of the transverse cross-section of the thermoelectric conversion member 1, for example along a circle of a mean radius of the thermoelectric conversion member 1.

$$V = \int_c^{2\pi} E_r d_r \quad (2)$$
$$\approx \int_c^{2\pi} Ea d\theta$$
$$= 2\pi a E$$

In the above equation (2), a stands for the mean radius of the ring-shaped thermoelectric conversion member 1.

The Nernst coefficient N is a physical quantity proper to a given material, and a magnitude and a plus or minus sign depend on the material.

It is noted that, if the temperature gradient is parallel to the direction of the magnetic field, no electric field is induced, as may be seen from the above formula (1). As shown in FIG. 2, the temperature gradient denoted as ∇T is perpendicular to the direction of the magnetic field H, a voltage is to be taken out from the thermoelectric conversion member 1 as a power source by providing electrodes 5 an 6 at the ends of the split ring shaped thermoelectric conversion member 1 and by connecting the electrodes 5 and 6 to the terminals respectively as shown in FIG. 2.

Figure 3:
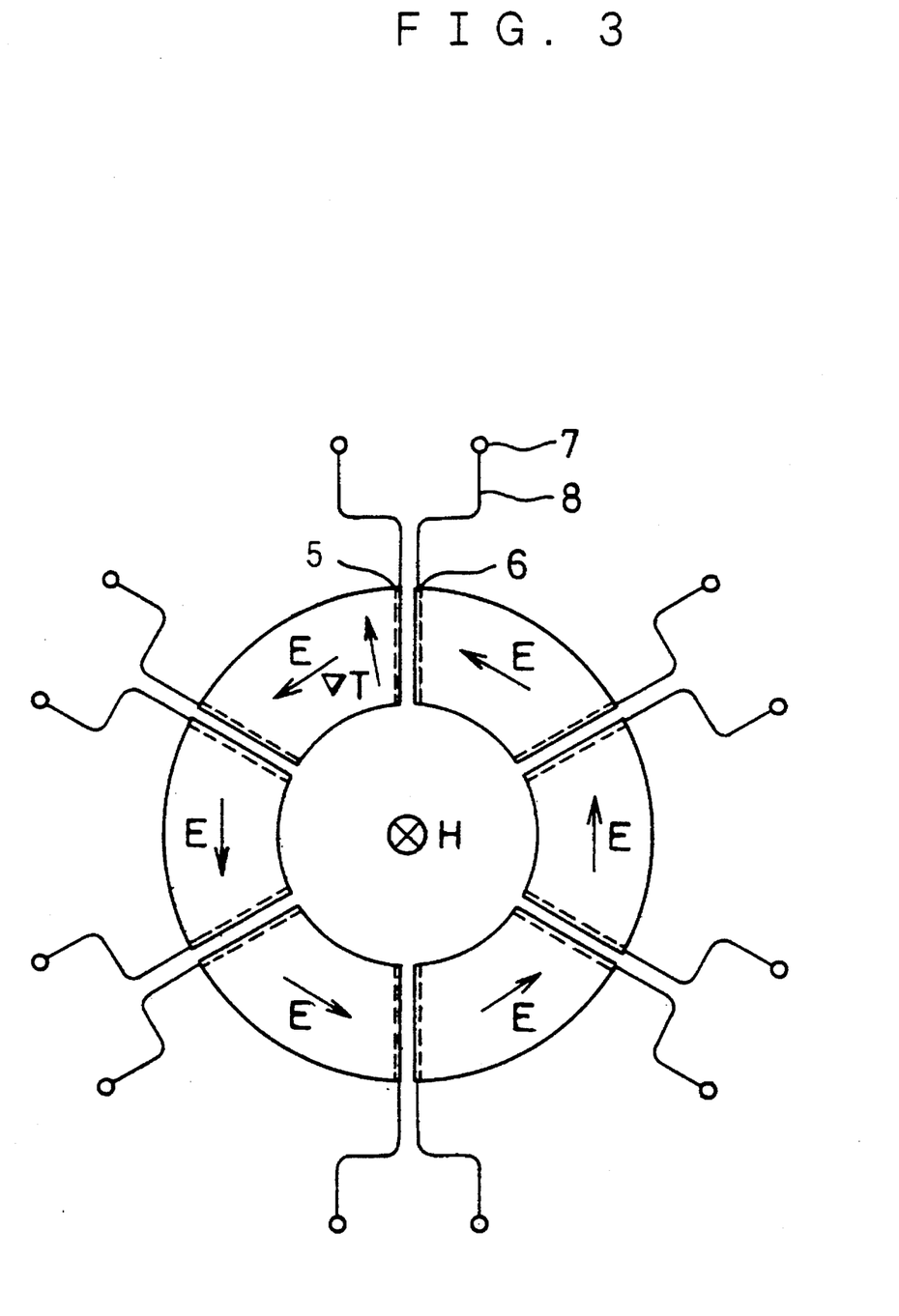
FIG. 3 is a transverse cross-sectional view showing a second aspect of the thermoelectric connecting member of the thermoelectric power generating device according to the first embodiment.

The thermoelectric conversion member 1 may be made up of plural components, the ends of which are electrically isolated from each other as shown in FIG. 3.

Referring to FIG. 3, each component has a negative electrode and a positive electrode mounted at its ends. By connecting a positive electrode of a given component in series with a negative electrode of a neighboring component, a sum voltage of output voltages of the respective components is outputted at a pre-determined terminal pair.

Figure 4:
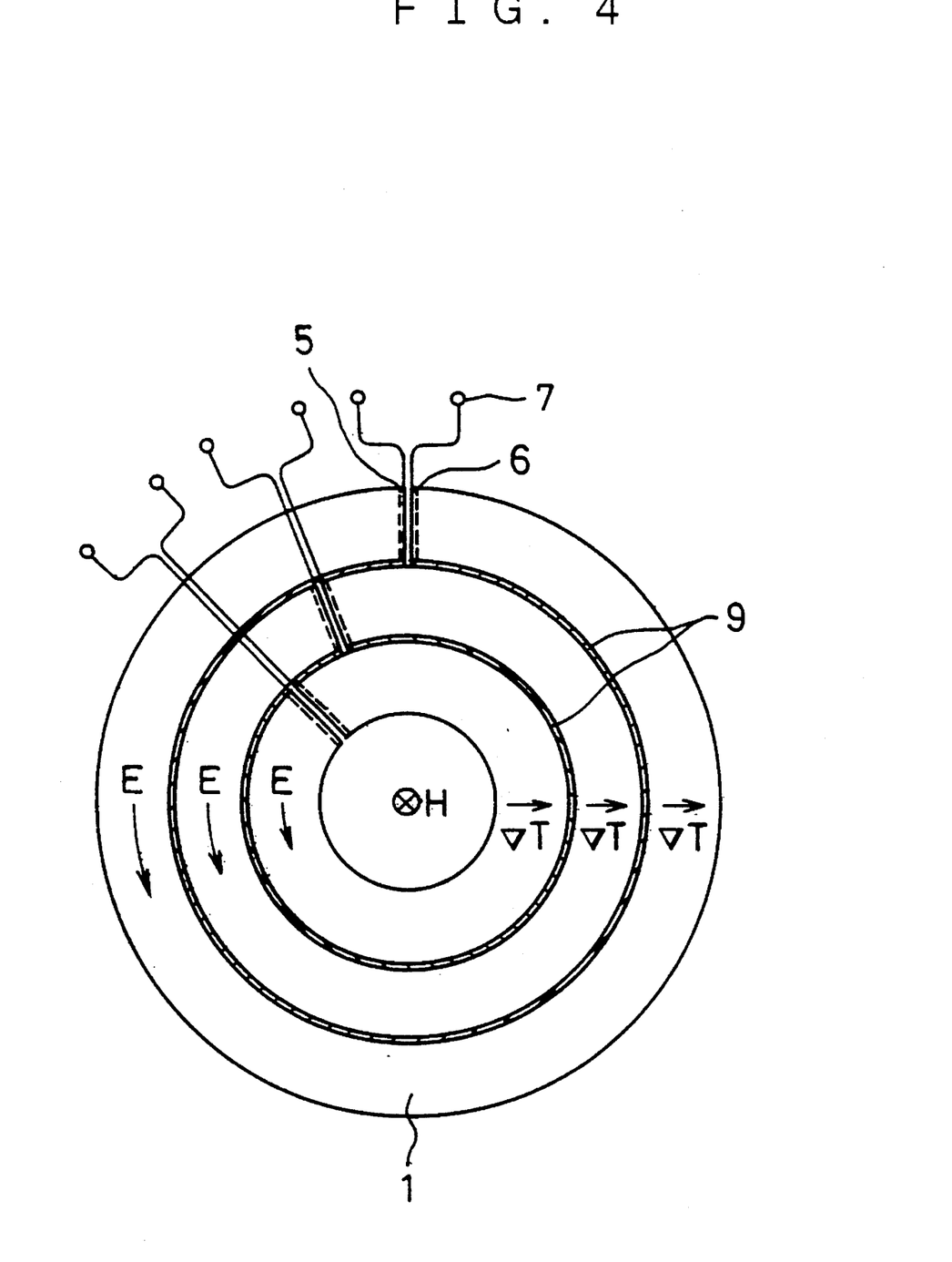
FIG. 4 is a transverse cross-sectional view showing a third aspect of the thermoelectric conversion member of the thermoelectric power generating device according to the first embodiment.

FIG. 4 shows an embodiment of the thermoelectric conversion member 1 in which plural thermoelectric conversion members 1 and plural insulating layers are stacked radially one on another. Each thermoelectric conversion member has a split ring shaped transverse cross section and a negative and positive electrodes mounted at the opposing ends.

With the serial connection of the terminals connected to the electrodes of the respective layers of the thermoelectric conversion member, an output voltage equal to $2\pi \Sigma E$ i×a i may be produced, where i is an integer from 1 up to the number n of the layers of the thermoelectric conversion member 1 and ai a mean radium of the layers of the thermoelectric conversion member 1.

One of the main reasons that such layered structure is adopted in the present embodiment is that the Nernst coefficient N is a function of a temperature and hence the layer structure may provide an optimum combination of thermoelectric materials for increasing an output of the thermoelectric power generating device.

Figure 5:
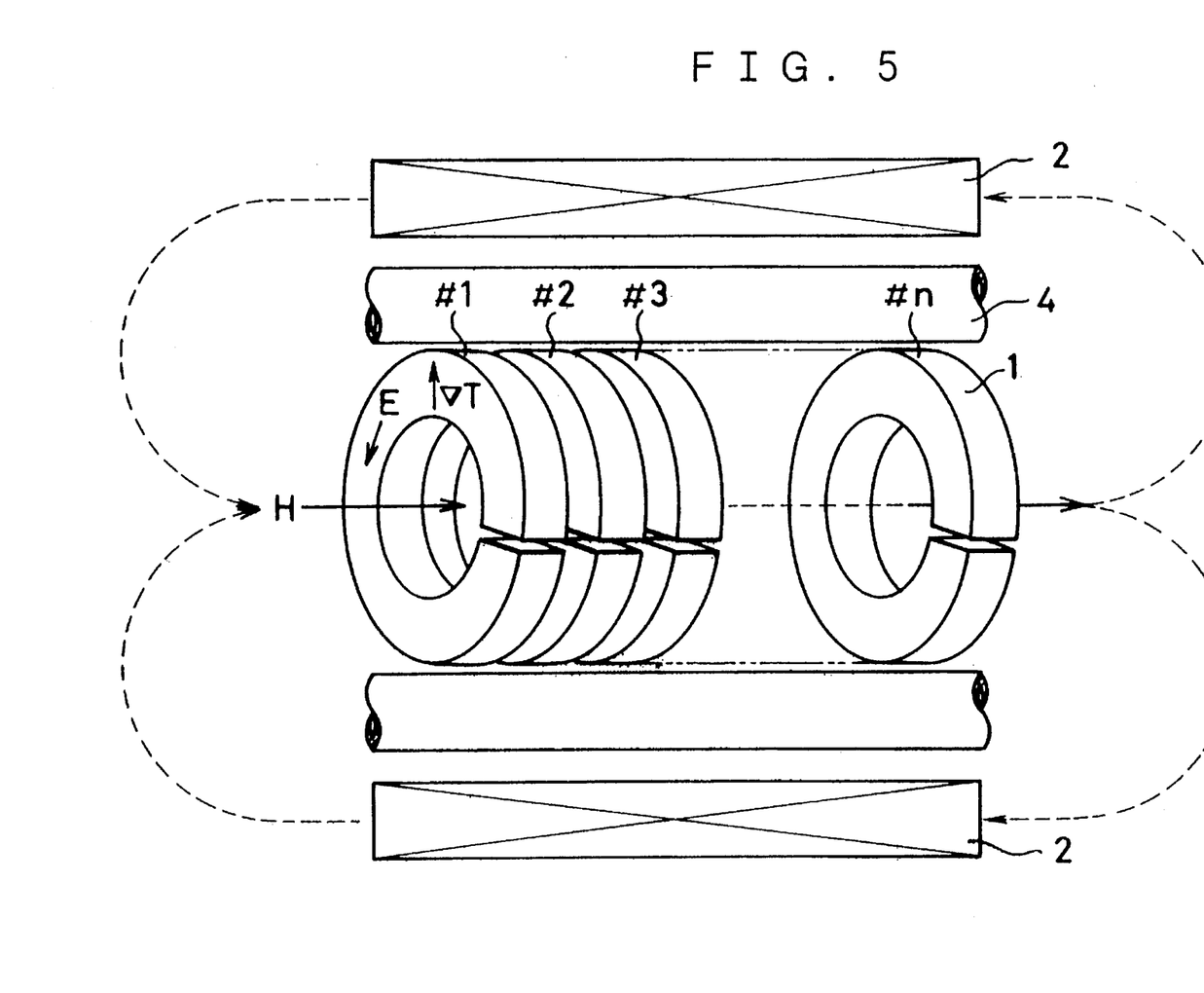
FIG. 5 is a transverse cross-sectional view showing a fourth aspect of the thermoelectric conversion member of the thermoelectric power generating apparatus according to the first embodiment.

FIG. 5 shows, as an alternative arrangement of the thermoelectric conversion member 1 of n-layer structure, in which the thermoelectric conversion members #1–#n are arranged alternately along the magnetic field direction and an insulating layer is provided between each pair of neighboring thermoelectric conversion members. Each thermoelectric conversion member has a spit ring shaped cross section and the electrode pair(a positive and a negative electrode) mounted on its opposite ends.

From the above equation (2), the voltage outputted to each electrode pair is $2\pi$ a E, where a is a mean ring radius. Consequently, if a plurality of, herein n, electrodes of the thermoelectric conversion member 1 are connected in series, an output voltage becomes equal to $n \times 2\pi$ a E, that is n times that derived from the arrangement of FIG. 1, can now be derived.

Although each layer may be formed of the same metal in FIGS. 4 and 5, the temperature differs from layer to layer, and hence the optimum combination of the materials may be employed.

For the thermoelectric conversion element effecting power generation by the Nernst effect, semiconductors may be preferably employed in place of metals.

In general, semiconductors are said to be weak against radiation rays. In the present embodiment, if the thermoelectric conversion member is formed of semiconductors, there exists no P-N junction plane, so that there is raised only a minor problem such as adverse effects of radiation rays on the power generating device. A higher output voltage may be produced with the use of semiconductors because of the higher value of the Nernst coefficient N.

The temperature gradient grad T(denoted also as $\nabla$ T) is determined by design parameters, such that it can be optionally changed within a predetermined range by changing the cross-sectional area and/or the length for the same material.

The thermoelectric power generation under the Nernst effect as shown in the present embodiment may be used in conjunction with thermocouples. The Nernst coefficient N is a function of the temperature such that the material of the thermoelectric conversion member may be selected depending on the temperature.

The annular inner wall section of the thermoelectric conversion member is coated with a heat-resistant material.

Embodiment 2

Figure 6:
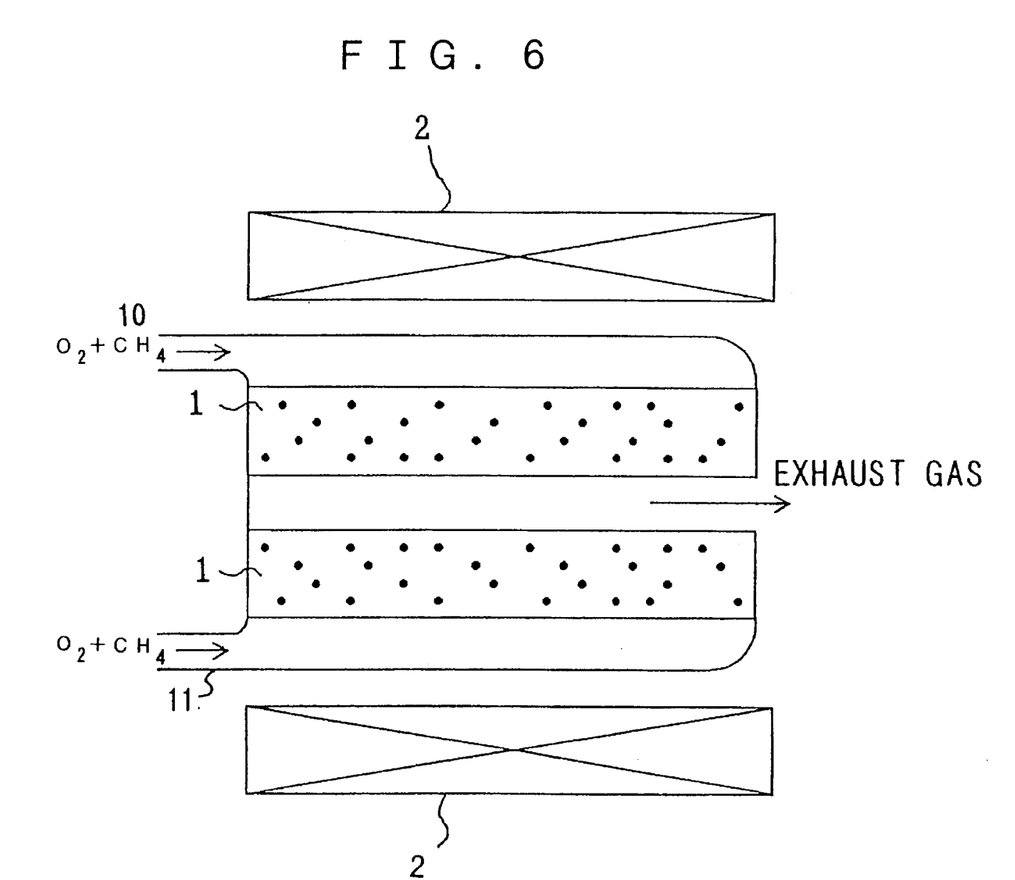
FIG. 6 is a schematic view showing a structure of a thermoelectric power generating apparatus according to a second embodiment of the present invention.

Referring to FIG. 6, a second embodiment of the present invention will be explained.

In the present embodiment, the thermoelectric conversion member 1 has the shape of a split ring formed of a semiconductor of a porous structure. A combustible gas 10, such as $O_2$ plus methane, is blown from the low-temperature side of the annular wall of the thermoelectric conversion member 1 via a gas supply duct 11 into the inside of the thermoelectric conversion member 1 so as to be combusted in the inside of the thermoelectric conversion member 1 and discarded from the opposite side of the annular wall of the thermoelectric conversion member 1. This generates a temperature difference larger in value than an ordinary temperature difference between the low temperature at the gas inlet side and the high temperature at the gas combustion side, with the direction of the temperature gradient being along the radial direction of the thermoelectric conversion member 1.

If the gas flows through a tiny hole, it is moved as it exchanges heat with the surrounding. There is no significant temperature rise at the inlet side where the gas absorbs heat, while the temperature in the vicinity of the outlet rises suddenly due to the heat transported by the gas in addition to a flame. A larger temperature difference is more effective for thermoelectric conversion.

In the present embodiment, since the combustible gas 10 transports heat and hence the effective heat conductivity of the thermoelectric conversion element is lowered, the efficiency index is improved.

In the present embodiment, a solenoid coil 2 generates a magnetic field in the longitudinal direction of the thermoelectric conversion member 1. Under the Nernst effect, an electric field E is generated along the circumference of the ring within the inside of the thermoelectric member 1, in accordance with the above equations (1) and (2), as in the above-described embodiment. Consequently, a voltage can be outputted to outside by electrodes provided at the ring ends of the thermoelectric conversion member 1.

Of course, thermoelectric conversion member 1 may take the form of a variety of rings as proposed in the previous embodiment.

Since the semiconductor of a porous structure forming the thermoelectric conversion member 1 according to the present embodiment is heated to a higher temperature, the thermoelectric conversion member 1 is preferably coated on its inner wall surface with a heat-resistant material in view of thermal resistance and resistance against oxidation.

Embodiment 3

Figure 8:
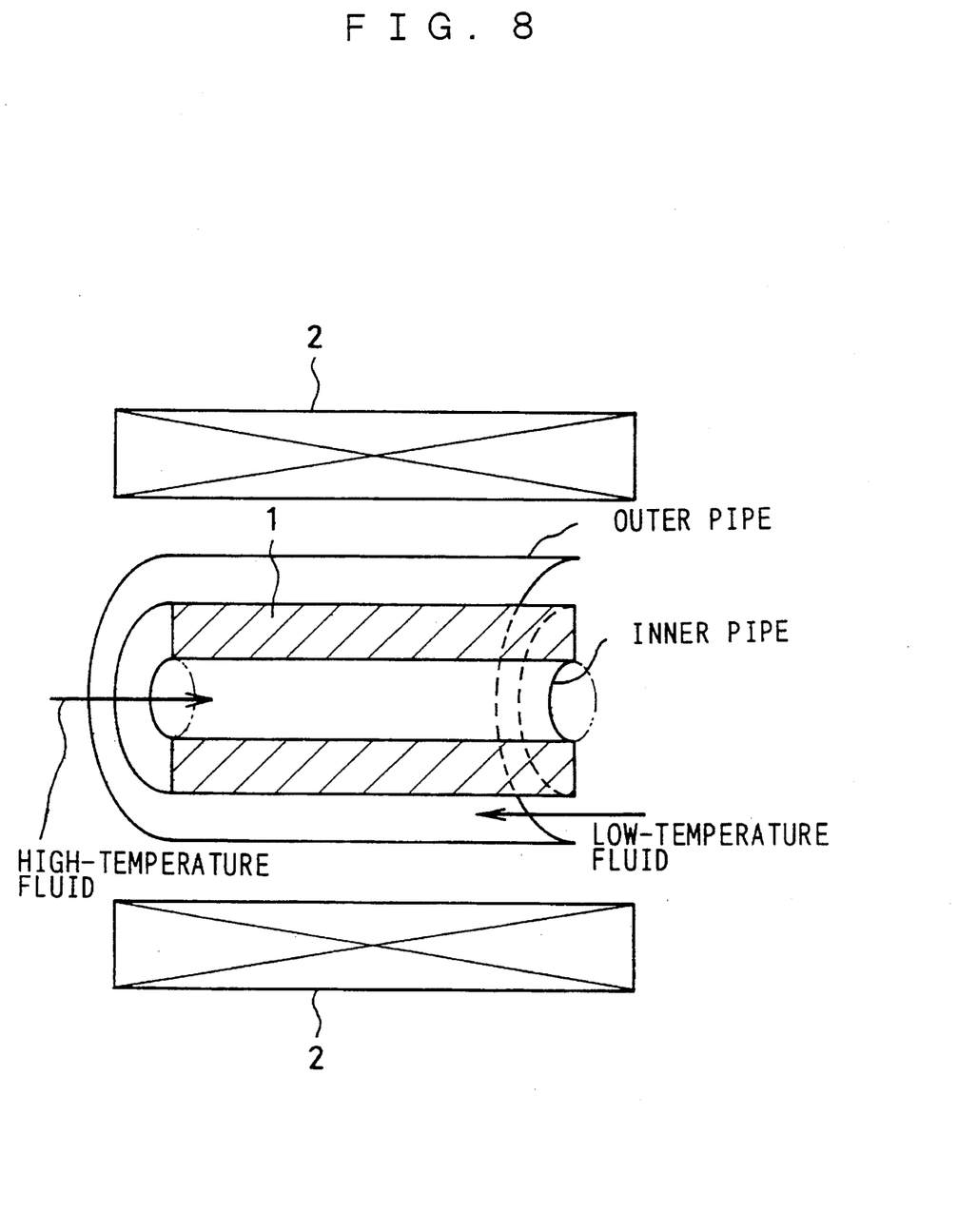
FIG. 8 is a schematic view showing a structure of a thermoelectric power generating device according to a third embodiment of the present invention.
Figure 9:
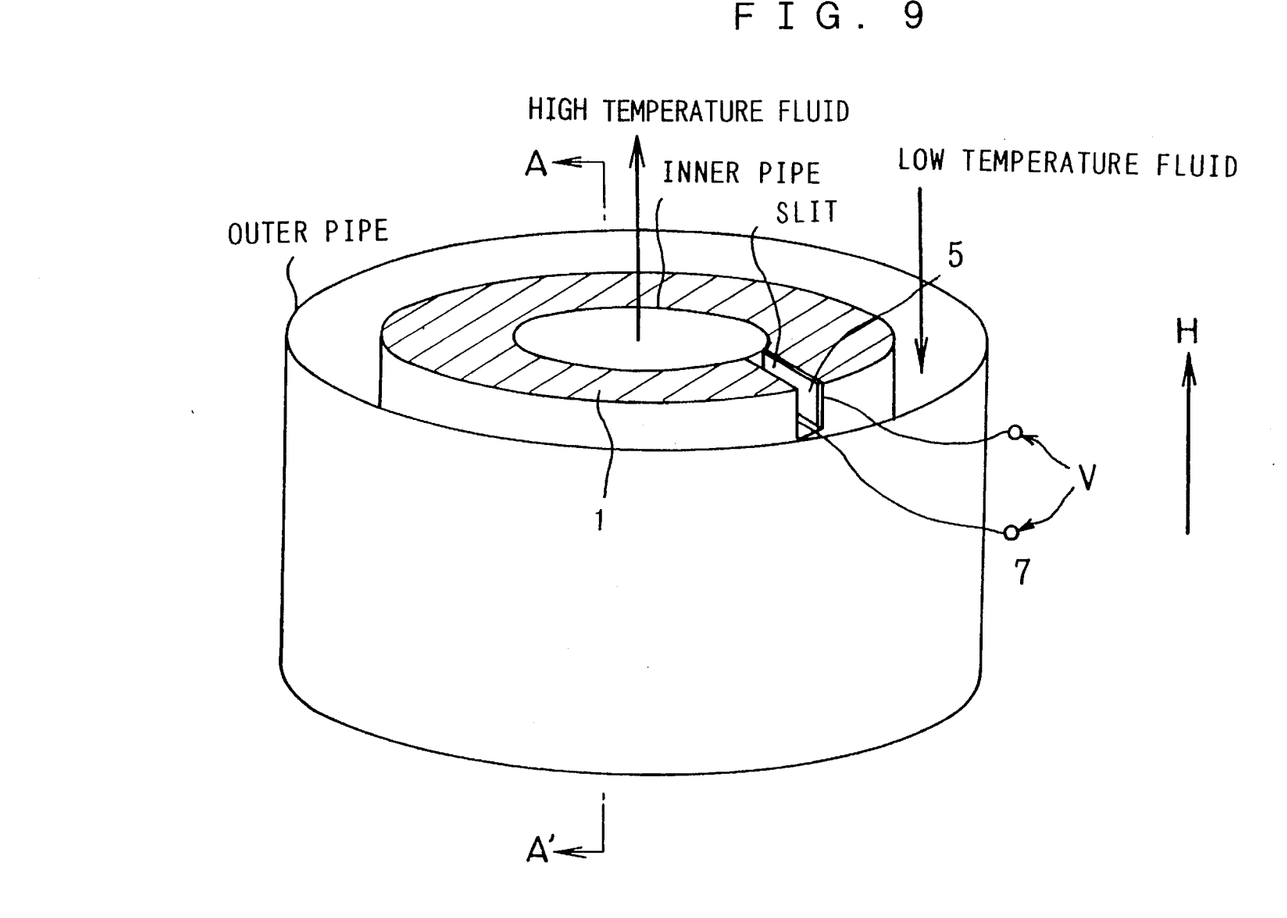
FIG. 9 is a perspective view showing the thermoelectric power generating device shown in FIG. 8.

Referring to FIGS. 8 and 9, a third embodiment of the present invention is explained. FIGS. 8 and 9 are a schematic cross-sectional view and a perspective view of a thermoelectric conversion apparatus of the present embodiment, respectively.

In the present embodiment, shown in FIGS. 8 and 9, a conversion pipe made up of an inner pipe and an outer pipe is provided, and a split ring shaped thermoelectric conversion member 1 is provided between the inner pipe and the outer pipe for encircling the inner pipe.

By causing one fluid at a high-temperature and another fluid at a low-temperature to flow in the inner pipe and in a space defined between the outer pipe and the thermoelectric conversion member 1, respectively, a temperature gradient is generated along a radial direction in the thermoelectric conversion member 1. A magnetic field is generated longitudinally of the pipe by a solenoid coil 2 (preferably a superconducting solenoid magnet) provided outside of the outer pipe. Under the Nernst effect, an electric field is induced in the thermoelectric conversion member 1 in a direction normal to both the direction of the temperature gradient and the direction of the magnetic field, that is in a circumferential direction of the ring, so that an electrical voltage may be taken out at the electrodes provided at opposite ring ends.

As the high-temperature fluid flowing through the inner pipe, a hot He gas, for example, is supplied from a nuclear fusion reactor or a nuclear reactor, not shown. As the low-temperature fluid flowing through the outer pipe, water may be employed.

In the present embodiment, the high-temperature fluid and the low-temperature fluid are at the same pressure in order to prevent an internal pressure in the semiconductor forming the thermoelectric conversion member 1 from being increased. Due to the elevated fluid pressure and velocity and the temperature difference between the He gas and water, it becomes possible to reduce the radial dimension of the energy conversion pipe, while a high-efficiency output may be produced by supplying a high-temperature gas.

Embodiment 4

Figure 10:
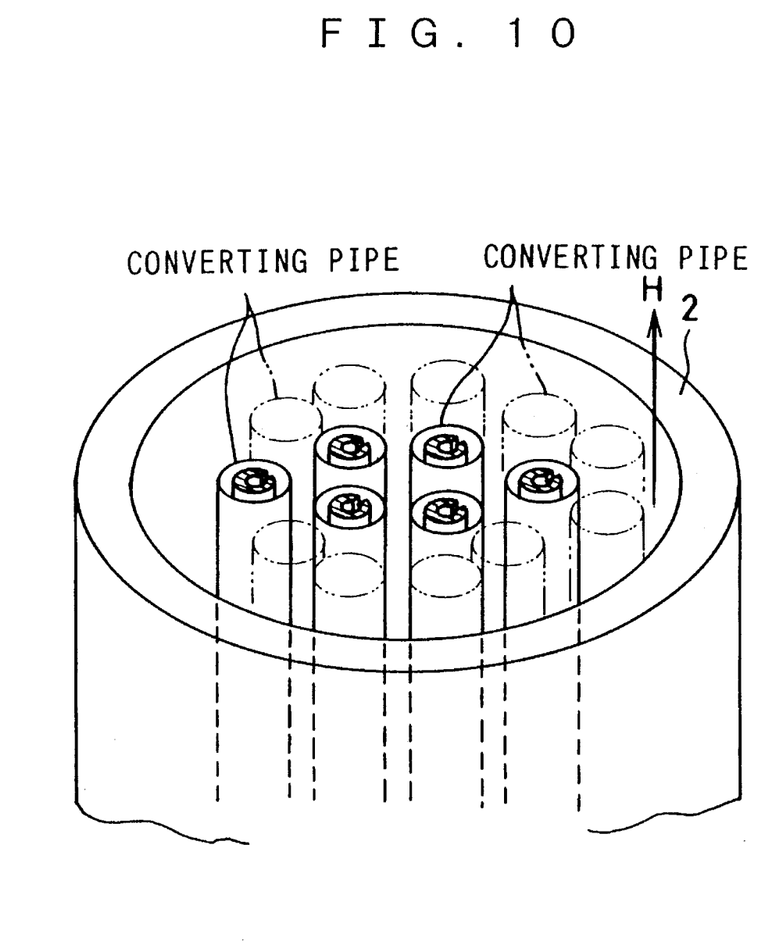
FIG. 10 is a perspective view showing a structure of a thermoelectric power generating apparatus according to a fourth embodiment of the present invention.

Referring to FIG. 10, a fourth embodiment of the present invention is explained. With the present embodiment, as shown therein, plural energy conversion pipes as explained in connection with the previous third embodiment are arranged in parallel longitudinally within a solenoid coil 2.

Each energy conversion pipe is arranged as shown in FIG. 9, that is, it includes an inner pipe having by a high-temperature fluid flowing through the inner pipe and an outer pipe having a low-temperature fluid having through the outer pipe. A thermoelectric conversion member 1 in the form of a split ring is provided between the inner and outer pipes.

In the present embodiment, electrodes provided at the ring ends of the thermoelectric conversion members 1 in the energy convertion pipe are connected in series. Thus the output voltage of the thermoelectric power generating device is the sum of output voltages of the conversion pipes. Alternatively, the electrodes of thermoelectric conversion members 1 associated with the conversion pipes may also be connected in parallel.

It is to be noted that the present invention may include various combinations of the above-described embodiments or various modifications conforming to the principle of the present invention.

What is claimed is:

1. A thermoelectric power generating device for generating electric power under the Nernst effect comprising:

a thermoelectric conversion member having a split ring transverse cross section with ring ends facing each other, said thermoelectric conversion member comprising at least one thermoelectric conversion element, a magnetic field generating unit for generating a magnetic field in a direction perpendicular to the transverse cross-sectional plane of said thermoelectric conversion member, a heating unit for heating an annular inner wall of said thermoelectric conversion member to produce a temperature gradient along a radial direction in said thermoelectric conversion member, a cooling unit at an annular outer wall of said thermoelectric conversion member, and electrodes disposed at said ring ends of said thermoelectric conversion member.

2. The thermoelectric power generating device as defined in claim 1 wherein said thermoelectric conversion member comprises a plurality of split ring thermoelectric conversion elements stacked via an insulating layer a long the radial direction.

3. The thermoelectric power generating device as defined in claim 2 wherein each of said plurality of thermoelectric conversion elements comprises electrodes disposed at ends thereof, said electrodes being interconnected in series or in parallel.

4. The thermoelectric power generating device as defined in claim 1 wherein said thermoelectric conversion member comprises a plurality of split ring thermoelectric conversion elements stacked via an insulating layer along the direction of the magnetic field.

5. The thermoelectric power generating device as defined in claim 4 wherein each of said plurality of thermoelectric conversion elements comprises electrodes disposed at ends thereof, said electrodes being interconnected in series or in parallel.

6. The thermoelectric power generating device as defined in claim 1, wherein the thermoelectric conversion member comprises a plurality of thermoelectric conversion elements being mutually electrically insulated and being arranged to form a ring, and a plurality of electrodes disposed at ends of said thermoelectric conversion elements, said electrodes being interconnected in series or in parallel.

7. The thermoelectric power generating device as defined in claim 1 wherein the thermoelectric conversion element comprises a semiconductor.

8. The thermoelectric power generating device as defined in claim 1 wherein said thermoelectric conversion member has an annular inner wall surface coated with a heat-resistant material.

9. A thermoelectric power generating device for generating electric power under the Nernst effect comprising:

a thermoelectric conversion member having a split ring transverse cross section with ring ends facing each other, said thermoelectric conversion member comprising at least one thermoelectric conversion element having a porous structure, a magnetic field generating unit for generating a magnetic field parallel to the longitudinal direction of said thermoelectric conversion member, a gas supplying unit for supplying a combustible gas from an annular outer wall of said thermoelectric conversion member, wherein the combustible gas flows through said thermoelectric conversion member to an annular inner wall of said thermoelectric conversion member, a combustion unit for combusting said combustible gas within said thermoelectric conversion member, a gas exhausting unit for exhausting said combustible gas from a center of said thermoelectric conversion member bounded by the annular inner wall, electrodes disposed at said ring ends of said thermoelectric conversion member.

10. The thermoelectric power generating device as defined in claim 9 wherein the thermoelectric conversion element comprises a semiconductor.

11. The thermoelectric power generating device as defined in claim 9 wherein said thermoelectric conversion member comprises a plurality of split ring thermoelectric conversion elements stacked via an insulating layer along the radial direction.

12. The thermoelectric power generating device as defined in claim 11 wherein each of said plurality of thermoelectric conversion elements comprises electrodes disposed at ends thereof, said electrodes being interconnected in series or in parallel.

13. The thermoelectric power generating device as defined in claim 9 wherein said thermoelectric conversion member comprises a plurality of split ring thermoelectric conversion elements stacked via an insulating layer along the direction of the magnetic field.

14. The thermoelectric power generating device as defined in claim 13 wherein each of said plurality of thermoelectric conversion elements comprises electrodes disposed at ends thereof, said electrodes being interconnected in series or in parallel.

15. The thermoelectric power generating device as defined in claim 9 wherein the thermoelectric conversion member comprises a plurality of thermoelectric conversion elements being mutually electrically insulated and being arranged to form a ring, and a plurality of electrodes disposed at ends of said thermoelectric conversion elements, said electrodes being interconnected in series or in parallel.

16. The thermoelectric power generating device for generating electric power under the Nernst effect comprising:

a pipe arrangement having coaxially arranged inner and outer pipes having different radial dimensions and a thermoelectric conversion member having a split ring transverse cross section with ring ends facing each other, said thermoelectric conversion member being arranged between the inner and outer pipes and encircling said inner pipe, said thermoelectric conversion member comprising at least one thermoelectric conversion element, a magnetic field generating unit for generating a magnetic field in a direction perpendicular to the transverse cross-sectional plane of said thermoelectric conversion member, and electrodes disposed at said ring ends of said thermoelectric conversion member, wherein an inside of said inner pipe is supplied with a first fluid at a high-temperature and a gap between said outer pipe and the thermoelectric conversion member is supplied with a second fluid at a low-temperature.

17. The thermoelectric power generating device as defined in claim 16 wherein the thermoelectric conversion element comprises a semiconductor.

18. A thermoelectric power generating device generating electric power under the Nernst effect comprising:

a plurality of pipe arrangements, each of said pipe arrangements comprising coaxially arranged inner and outer pipes having different radial dimensions and a thermoelectric conversion member having a split ring transverse cross section with ring ends facing each other, said thermoelectric conversion member being arranged between the inner and outer pipes and encircling said inner pipe, said thermoelectric conversion member comprising at least one thermoelectric conversion element, electrodes disposed at said ring ends of said thermoelectric conversion member, wherein an inside of said inner pipe is supplied with a first fluid at a high-temperature and a gap between said outer pipe and the thermoelectric conversion member is supplied with a second fluid at a low-temperature, and a magnetic field generating unit for generating a magnetic field parallel to the longitudinal direction of said plurality of pipe arrangements.

19. The thermoelectric power generating device as defined in claim 18 wherein the electrodes of the thermoelectric conversion members in said pipe arrangements are connected in series or in parallel.

20. The thermoelectric power generating device as defined in claim 18 wherein the thermoelectric conversion element comprises a semiconductor.

* * * * *